United States Patent
Frisch et al.

(10) Patent No.: US 8,258,793 B2
(45) Date of Patent: Sep. 4, 2012

(54) METHOD FOR USE WHEN CHARGING A VEHICLE BATTERY PACK

(75) Inventors: Damon R. Frisch, Troy, MI (US); Brian J. Koch, Berkley, MI (US); Gregory E. Smith, Toledo, OH (US); Monica E. Dykas, Brighton, MI (US); John E. Novak, Dexter, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 375 days.

(21) Appl. No.: 12/640,625

(22) Filed: Dec. 17, 2009

(65) Prior Publication Data

US 2011/0148363 A1    Jun. 23, 2011

(51) Int. Cl.
*H01M 10/44* (2006.01)
(52) U.S. Cl. .................................................. 324/433
(58) Field of Classification Search .................. 320/104, 320/107, 112, 114, 115, 132, 134, 136, 149; 324/426, 427, 431, 433
See application file for complete search history.

(56) References Cited

U.S. PATENT DOCUMENTS

| | | | | |
|---|---|---|---|---|
| 5,307,001 A | * | 4/1994 | Heavey | 320/125 |
| 2006/0071634 A1 | * | 4/2006 | Meyer et al. | 320/112 |
| 2008/0252257 A1 | * | 10/2008 | Sufrin-Disler et al. | 320/118 |

* cited by examiner

*Primary Examiner* — Edward Tso
(74) *Attorney, Agent, or Firm* — Lionel D. Anderson; Reising Ethington P.C.

(57) ABSTRACT

A method for use with a vehicle battery pack, where the method determines a voltage threshold that may prevent the vehicle battery pack from being overcharged. The voltage threshold may be a dynamic threshold that changes or adjusts over time in order to accommodate changing conditions in the vehicle battery pack, the vehicle and/or the surrounding environment. The method may consider one or more battery readings when determining the voltage threshold, including temperature, voltage and/or current readings. According to one embodiment, the method is designed to accommodate high-current, short-duration charging events, like regenerative breaking.

17 Claims, 3 Drawing Sheets

Figure 3

20°C Window Group (300)

Maximum Window
Current Parameter – None
Voltage Parameter – 345 V
Counter Parameter – None
Maximum Window Counter 3rd Window
Current Parameter – 30 A
Voltage Parameter – 320V
Counter Parameter – 50 Counts
3rd Window Counter 2nd Window
Current Parameter – 20 A
Voltage Parameter – 315V
Counter Parameter – 100 Counts
2nd Window Counter 1st Window
Current Parameter – 10 A
Voltage Parameter – 310V
Counter Parameter – 200 Counts
1st Window Counter Minimum Window
Current Parameter – None
Voltage Parameter – 305V
Counter Parameter – 500 Counts
Minimum Window Counter

25°C Window Group (302)

Maximum Window
Current Parameter – None
Voltage Parameter – 340 V
Counter Parameter – None
Maximum Window Counter 3rd Window (330, 332, 334, 336)
Current Parameter – 30 A
Voltage Parameter – 315V
Counter Parameter – 50 Counts
3rd Window Counter 2nd Window
Current Parameter – 20 A
Voltage Parameter – 310V
Counter Parameter – 100 Counts
2nd Window Counter 1st Window
Current Parameter – 10 A
Voltage Parameter – 305V
Counter Parameter – 200 Counts
1st Window Counter Minimum Window
Current Parameter – None
Voltage Parameter – 300V
Counter Parameter – 500 Counts
Minimum Window Counter

30°C Window Group (304)

Maximum Window
Current Parameter – None
Voltage Parameter – 335 V
Counter Parameter – None
Maximum Window Counter 3rd Window
Current Parameter – 30 A
Voltage Parameter – 310V
Counter Parameter – 50 Counts
3rd Window Counter 2nd Window
Current Parameter – 20 A
Voltage Parameter – 305V
Counter Parameter – 100 Counts
2nd Window Counter 1st Window
Current Parameter – 10 A
Voltage Parameter – 300V
Counter Parameter – 200 Counts
1st Window Counter Minimum Window
Current Parameter – None
Voltage Parameter – 295V
Counter Parameter – 500 Counts
Minimum Window Counter Reference labels: 318, 316, 314, 312, 310

METHOD FOR USE WHEN CHARGING A VEHICLE BATTERY PACK

TECHNICAL FIELD

The present invention generally relates to a method for use with a vehicle battery pack and, more particularly, to a method that determines a voltage threshold that may be used when charging a vehicle battery pack so that it is not overcharged.

BACKGROUND

Charging a vehicle battery pack in a hybrid electric vehicle (HEV), a plug-in hybrid electric vehicle (PHEV), a battery electric vehicle (BEV), or some other type of vehicle can sometimes result in an overcharged or undercharged battery condition; neither of which is particularly desirable.

An overcharged battery condition may result in a breakdown of the electrolytic material, gassing, swelling, overheating and/or other undesirable phenomena that can diminish the overall performance or state of the battery pack. Overcharging can occur, for example, when a battery pack is left charging at a relatively low current for a significant amount of time. An undercharged battery pack, on the other hand, may be a performance handicap because energy that is otherwise available for the battery pack is left unutilized. For instance, certain vehicle battery packs have a voltage threshold or voltage lid that exceeds the 100% state-of-charge (SOC) voltage for the battery pack (this may allow for rapid charging during regenerative braking and other events that involve high amounts of current for short periods of time). If the voltage threshold for a battery pack is set too low, then energy that is otherwise available for the battery pack is left unused.

Therefore, there may be a need for a method that determines a voltage threshold for a vehicle battery pack and takes overcharged and undercharged considerations into account.

SUMMARY

According to one embodiment, there is provided a method for use with a vehicle battery pack. The method may comprise the steps of: (a) receiving one or more battery reading(s) for the vehicle battery pack; and (b) using the battery reading(s) to determine a voltage threshold for the vehicle battery pack.

According to another embodiment, there is provided a method for use with a vehicle battery pack. The method may comprise the steps of: (a) receiving one or more battery reading(s) for the vehicle battery pack, wherein the battery reading(s) include a temperature reading; (b) using the temperature reading to select a voltage threshold; and (c) altering the voltage threshold over time to accommodate changes in the vehicle battery pack.

According to another embodiment, there is provided a method for use with a vehicle battery pack. The method may comprise the steps of: (a) receiving a voltage reading and a current reading for the vehicle battery pack; (b) evaluating the voltage reading and the current reading against a voltage parameter and a current parameter, respectively, and if the voltage reading and the current reading satisfy the voltage parameter and the current parameter then incrementing a counter; and (c) establishing a new voltage threshold when the counter exceeds a counter parameter.

BRIEF DESCRIPTION OF THE DRAWINGS

Preferred exemplary embodiments of the invention will hereinafter be described in conjunction with the appended drawings, wherein like designations denote like elements, and wherein:

FIG. 3 is a schematic block diagram of some exemplary window groups that are provided to help illustrate the exemplary method of FIG. 2.

DETAILED DESCRIPTION OF THE PREFERRED EMBODIMENTS

Figure 1:
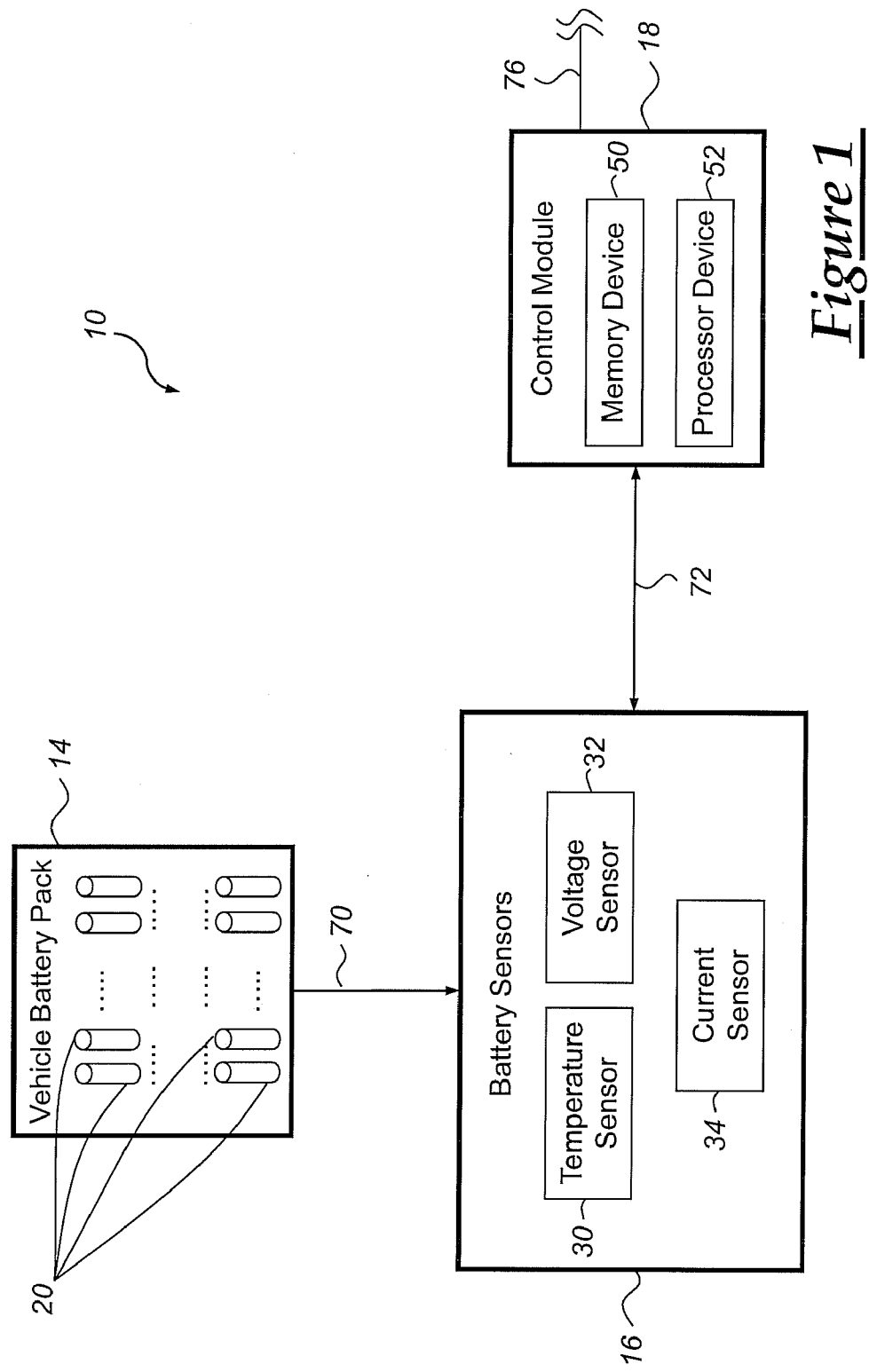
FIG. 1 is a schematic block diagram of an exemplary battery system.

With reference to FIG. 1, there is shown a general and schematic view of an exemplary vehicle battery system 10 that includes a vehicle battery pack having a number of individual battery cells. The method described below may gather information from the vehicle battery pack—for instance, information regarding temperature, voltage, current and/or other battery readings—and use that information to determine a voltage threshold. The voltage threshold may then be used during charging of the vehicle battery pack so that it is not overcharged. It should be appreciated that the present method may be used with any type of vehicle battery pack, including those found in hybrid electric vehicles (HEVs), plug-in hybrid electric vehicles (PHEVs), and battery electrical vehicles (BEVs), to name but a few. It is even possible to use the present method with other non-vehicle battery packs, such as those employed by uninterruptible power supplies, for instance. These are merely some of the possible applications, as the method described herein is not limited to the exemplary vehicle battery system shown in FIG. 1 and could be used with any number of different battery systems. According to one embodiment, vehicle battery system 10 includes a vehicle battery pack 14, battery sensors 16, and a battery control module 18.

Vehicle battery pack 14 provides the vehicle with electrical power and, depending on the particular embodiment, may be the primary vehicle power source or may be used in conjunction with another power source. Vehicle battery pack 14 includes a collection of individual battery cells 20 that are connected in series, parallel, or a combination of both in order to deliver a desired voltage, amperage, capacity, power density, and/or other performance characteristics. Generally, it is desirable for the vehicle battery pack to provide high power and energy densities, which has led to the development and use of many types of batteries including chemical, non chemical, and others. Some examples of suitable battery types that may be used by vehicle battery pack 14 include: all types of lithium-ion (e.g., lithium iron phosphate, lithium nickel manganese cobalt, lithium iron sulfide, lithium polymer, etc.), lead-acid, advanced lead-acid, nickel metal hydride (NiMH), nickel cadmium (NiCd), zinc bromide, sodium nickel chloride (NaNiCl), zinc air, vanadium redox, and others. Vehicle battery pack 14 may provide approximately 40-600V, depending on its particular design and application. For example, a heavy truck using a two-mode hybrid system may require a high voltage battery pack capable of providing about 350V, where a lighter vehicle may only need about 200V. In another embodiment, vehicle battery system 10 may be part of a belt-alternator-starter (BAS) or BAS-plus type system and thus only require a battery pack that provides about 40-110V. In any case, vehicle battery pack 14 should be designed to withstand repeated charge and discharge cycles. Skilled artisans will appreciate that the system and method described herein are not limited to any one particular type of battery or battery arrangement, as a number of different battery embodiments could be used.

Battery sensors 16 may include any combination of hardware and/or software components capable of monitoring, sensing or otherwise determining battery conditions such as temperature, voltage, current, etc. According to one exemplary embodiment, battery sensors 16 include a temperature sensor 30, voltage sensor 32, and current sensor 34. Battery sensors 16 may be integrated within vehicle battery pack 14 (e.g., an intelligent or smart battery), they may be external sensors located outside of the vehicle battery pack (as schematically shown in FIG. 1), or they may be provided according to some other arrangement. Battery sensors 16 may monitor, sense or otherwise determine battery conditions for one or more individual cells, for a collection or block of cells within vehicle battery pack 14 (i.e., a subset of the overall collection of cells), for the entire vehicle battery pack, or according to some other method known in the art. According to one embodiment, battery sensors 16 provide battery readings for vehicle battery pack 14 on an overall or pack basis (e.g., an overall battery temperature, battery voltage, and battery current reading for the entire vehicle battery pack). This is, of course, only one possibility, as the battery readings may be provided according to other techniques as well. Battery sensors 16 may employ any type of suitable technique or method for measurement, estimation, evaluation, etc.; this includes both directly and indirectly determining battery conditions. Output from battery sensors 16 may be provided to battery control module 18 or some other appropriate device in the form of battery readings via a suitable vehicle communications connection 72 (e.g, a CAN bus, a SPI connection, etc.).

Battery control module 18 may include any variety of electronic processing devices, memory devices, input/output (I/O) devices, and/or other known components, and may perform various control and/or communication related functions. In an exemplary embodiment, battery control module 18 includes an electronic memory device 50 that stores various sensor readings (e.g., battery readings from sensors 30, 32, 34, etc.), look up tables or other data structures, algorithms, etc. Memory device 50 may also store pertinent battery characteristics and background information pertaining to the battery's cell chemistry, cell capacity, upper and lower battery voltage limits, battery current limits, battery temperature limits, temperature profiles, battery impedance, number or history of charge/discharge cycles, etc. In the exemplary embodiment shown in FIG. 1, battery control module 18 also includes a processor device 52 (e.g., a microprocessor, a microcontroller, an application specific integrated circuit (ASIC), etc.) that executes instructions for software, firmware, programs, algorithms, scripts, etc. that are stored in memory device 50 and may govern the processes and methods described herein. Battery control module 18 may be electronically connected to other vehicle devices and modules via a suitable vehicle communications connection 76 and can interact with them when required. These are, of course, only some of the possible arrangements, functions and capabilities of battery control module 18, as other embodiments could also be used.

Depending on the particular embodiment, battery control module 18 may be a stand-alone vehicle electronic module (e.g., a vehicle control integrated module (VCIM), a traction power inverter module (TPIM), a battery power inverter module (BPIM), etc.), it may incorporated or included within another vehicle electronic module (e.g., a power train control module or a hybrid control module), or it may be part of a larger network or system (e.g., a battery management system (BMS), a vehicle energy management system, etc.), to name a few possibilities. Battery control module 18 may also be part of or interact with a system that determines a desired hybrid operating mode (e.g., accelerating, braking, idling, stopping, etc.) and may implement electrical power management actions accordingly. Many different battery types and arrangements may be used with the method described below; for instance, the vehicle battery pack 14, battery sensors 16, and control module 18 may all be integrated and included within one package or they could be separate techniques. The method discussed below is not limited to the exemplary vehicle battery system shown in FIG. 1, as that system is simply provided for purposes of illustrating one potential application for the method.

Figure 2:
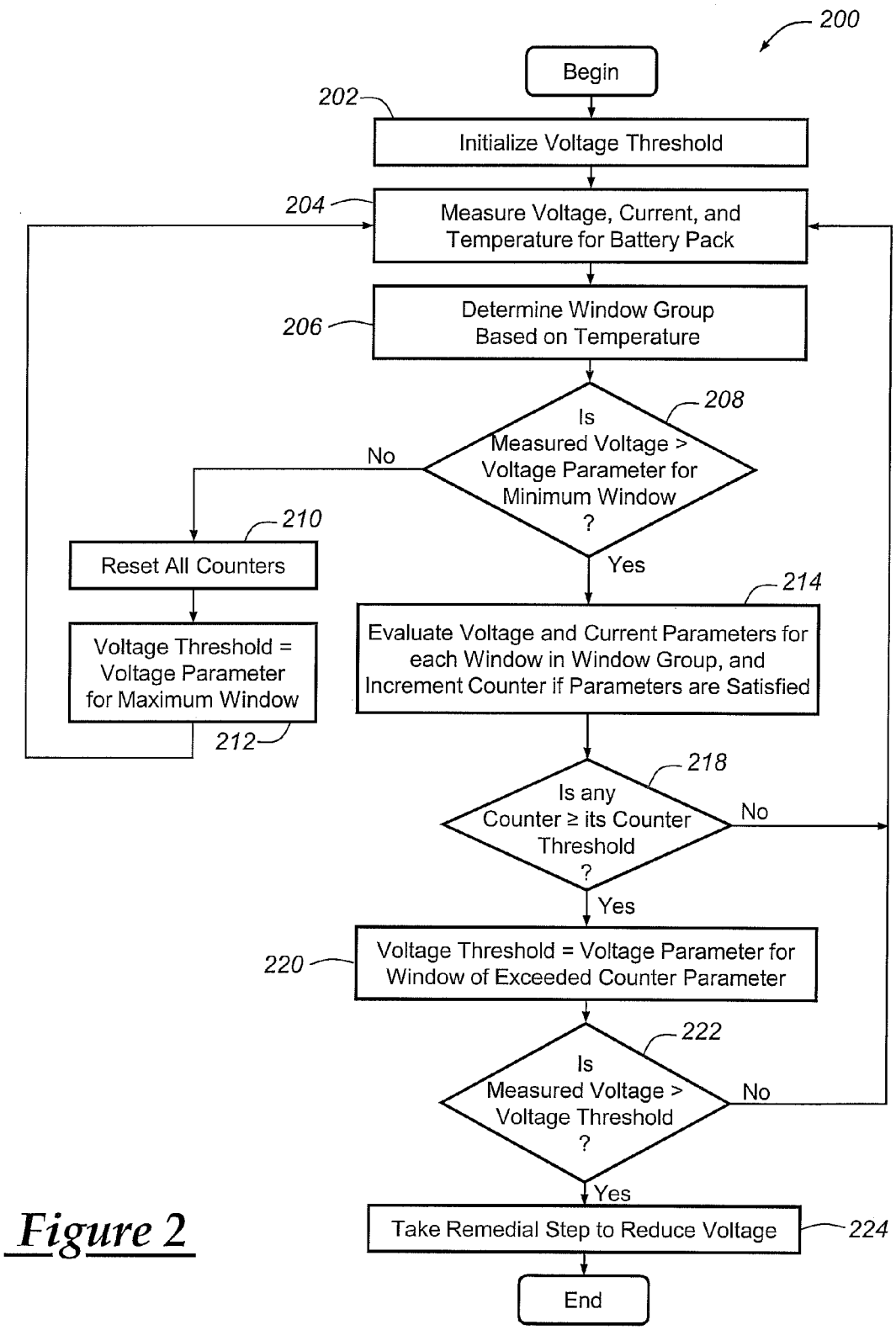
FIG. 2 is a flowchart of an exemplary method that may be used with the exemplary battery system of FIG. 1 to determine a voltage threshold when charging a vehicle battery pack.

Turning now to the flowchart in FIG. 2, there is illustrated an exemplary method 200 that may be used during a charging process to determine a voltage threshold that prevents a vehicle battery pack from being overcharged. The voltage threshold described below may be a dynamic threshold that changes or adjusts over time in order to accommodate changing conditions in the vehicle battery pack, the vehicle and/or the surrounding environment. Skilled artisans will appreciate that if the voltage threshold is set too low then it may be unnecessarily restrictive and result in the battery pack being undercharged, and if the voltage threshold is set too high then it may be too lenient and result in the battery pack being overcharged. Therefore, in one embodiment of the present method, a dynamic voltage threshold is generated that attempts to optimize the charging process by taking both overcharging and undercharging considerations into account. Although method 200 may be particularly well suited for certain battery chemistries—like nickel-metal-hydride (NiMH) and other batteries that allow for short durations of high current charging that result in the battery exceeding 100% of its state of charge (SOC)—the exemplary method may be used with any battery chemistry and is not limited to any particular battery type. Moreover, method 200 may be used with any charging event or process including, but certainly not limited to, regenerative charging and plug-in charging.

Beginning at step 202, the method initializes a voltage threshold. The "voltage threshold," as used herein, broadly includes any limit, maximum, ceiling, cutoff, or other threshold that may be used to limit or govern the amount of energy provided to the vehicle battery pack during a charging process. Step 202 initializes the voltage threshold with a value that may be determined according to a number of different techniques. According to one embodiment, step 202 simply uses a predefined or predetermined default voltage threshold; such a threshold may be determined during design and testing of the vehicle and/or the battery pack and may be stored at battery control module 18. In another embodiment, step 202 takes a temperature reading for the vehicle battery pack 14 and uses it to select a temperature-based window group. The voltage threshold is then initialized by setting the voltage threshold equal to the least restrictive voltage parameter in the selected window group. This process of selected and using window groups will be subsequently explained in more detail. Other techniques for initializing the voltage threshold may be used as well. Typically, the voltage threshold selected in step 202 is the least restrictive voltage threshold that is used by the method until the voltage threshold is initialized again; however, this is not necessary. As the method proceeds, the voltage threshold is usually lowered so that it has a more restrictive or limiting value. This concept will also be subsequently discussed in more detail. In one embodiment, the voltage threshold initialized in step 202 is stored in memory device 50 which is located in battery control module 18 or some other suitable piece of hardware.

Next, step 204 takes voltage, current and/or temperature readings for the vehicle battery pack. These battery readings may be gathered or otherwise determined in any number of different ways. For example, sensors 30, 32 and 34 could respectively measure the temperature, voltage and current of battery pack 14 and then provide the corresponding battery readings for use in step 204. In another example, the temperature, voltage and current readings could be acquired indirectly from some other device, such as another vehicle electronic module (VEM) located elsewhere in the vehicle. Other techniques for gathering temperature, voltage and/or current data could also be employed. The various battery readings gathered in step 204 may be provided on a cell-by-cell basis (e.g., separate readings for different cells), on a cell group-by-cell group basis (e.g., average readings for an entire group or block of cells or region of the battery pack), on a representative cell basis (e.g., worst or best case readings for the battery pack, randomly selected battery cells, etc.), on a pack basis (e.g., an average voltage, current and/or temperature reading for the entire battery pack), or according to some other suitable basis. The following exemplary description assumes that the battery readings are provided on a pack basis where the temperature, voltage and/or current readings are representative of the entire battery pack 14.

The battery readings gathered in step 204, as well as any other data gathered in the exemplary method 200, may be representative of a single value, a number of values averaged or filtered over time, and/or values obtained according to some other technique known in the art. For instance, the temperature, voltage and/or current readings obtained in step 204 may be gathered over a sampling period and then averaged or filtered according to a known technique in order to reduce noise and avoid any temporary fluctuations in the data. Some exemplary techniques that may be used include low-pass filters, simple moving averages (SMA), cumulative moving averages (CMA), weighted moving averages (WMA) and/or exponential moving averages (EMA), to cite a few. Other techniques are certainly possible.

Next, step 206 uses one or more of the battery readings gathered in the previous step to determine or select a window group. For purposes of illustration, step 206 is described in conjunction with the schematic block diagram in FIG. 3, which shows several exemplary window groups 300, 302, and 304 that are organized according to battery temperature. A "window group," as used herein, broadly includes any collection of parameters, thresholds or other data that is based around a particular battery reading and may be used to determine a voltage threshold. For example, each of the exemplary window groups 300-304 is a collection of different parameters that is based around battery temperature (window group 300 is for 20° C., window group 302 is for 25° C., window group 304 is for 30° C., and so on) and may be used by method 200 to determine a voltage threshold. Temperature-based window groups are not the only possibility, as window groups 300-304 could instead by based on current or some other battery reading. The various window groups may cover only discrete battery readings (e.g., window group 300 could specifically be for temperature readings of 20° C.), they may cover a range of battery readings (e.g., window group 300 could be for temperature readings ranging from 15°-20° C. or 20°-25° C., instead of just 20° C.), or they can be provided according to some other technique. It should be appreciated that the description of the window groups, the windows and the various parameters are provided in conjunction with FIG. 3 simply for purposes of illustration, and that in actual practice these items may be implemented using any number of structures or techniques that maintain or store data.

According to an exemplary embodiment, window groups 300-304 are for discrete battery temperatures, however, intermediate temperatures may be interpolated between two successive window groups instead of rounding up or down to the next nearest window group. To illustrate, if the temperature reading for the battery pack is 22.5° C., then a window group (not shown) is determined by interpolating the data between the 20° C. window group (i.e., window group 300) and the 25° C. window group (i.e., window group 302). Because 22.5° C. is halfway between 20° C. and 25° C., the data in the interpolated window group (not shown) could be exactly halfway between that in window groups 300 and 302. It should be appreciated that the preceding examples only address some of the possibilities for determining or selecting a window group, as other techniques and methods are certainly possible. For instance, the determination or selection of a window group may also take into account factors such as driving conditions, vehicle performance, driver objectives, the age of batteries, etc. The terms "determined window group" and "selected window group" are used herein in an interchangeable manner.

The actual data in the various window groups may be empirically determined during the design or testing of the vehicle and/or the battery pack, it may be periodically updated at the vehicle, and it may be organized or maintained in any number of different data structures. In an exemplary embodiment, the window groups used with method 200 extend from −30° C. to 50° C. and are provided in 10° C. increments using interpolation for in-between temperature values. The data in these window groups may be maintained in one-dimensional or multi-dimensional look-up tables, for example, or in any other suitable data structure known to skilled artisans. The nature and usefulness of the different window groups will be more apparent from the following paragraphs, where each of the exemplary window groups 300-304 includes one or more windows, and each window includes one or more parameters and a counter. Although the following description is directed to exemplary window group 302, it applies to other window groups as well. Window group 302 is based on a battery temperature reading of 25° C. and includes a number of windows 310-318, each of which further includes a number of parameters 330-334 and a counter 336.

Generally speaking, each window has a voltage parameter that may potentially be adopted by the method as the overall voltage threshold for the battery pack. The algorithm may use the other parameters in the window (i.e., the current and counter parameters), as well as the battery readings previously taken, to determine which voltage parameter should in fact be adopted and used as the overall voltage threshold. Furthermore, this voltage threshold may be dynamic such that it changes and adapts over time to changing conditions inside and outside of the vehicle battery pack. By using both voltage and current parameters to determine a dynamic voltage threshold, method 200 is able to take advantage of certain high-current, short-duration charging events (such as regenerative braking) that would otherwise likely exceed a typical static voltage threshold.

Window 310 is the lowest or minimum window within window group 302 and, as such, it has the lowest or most restrictive voltage parameter (in this case, 300V). This means that if method 200 were to select minimum window 310 and adopt its voltage parameter of 300V as the overall voltage threshold, the maximum amount of voltage that could be deposited on the battery pack is 300V, which is the most restrictive threshold for window group 302 or the 25° C.

temperature range. Window 310 also includes a current parameter, a counter parameter, and a counter, which will be described below in more detail. As illustrated in FIG. 3, the voltage and current parameters generally increase from the minimum window 310 to the maximum window 318. In this example, the voltage parameter increases by 5V per window and the current parameter increase by 10 A per window, however, other increments or steps may be used instead. The counter parameter, on the other hand, generally decreases or goes down from the minimum window 310 to the maximum window 318. It should be pointed out that minimum window 310 does not have a current parameter, and maximum window 318 does not have either a current parameter or a counter parameter. The reasons for this will become more apparent as the discussion of exemplary method 200 continues.

A comparison of the exemplary window groups 300-304 in FIG. 3 reveals some general patterns. For instance, the corresponding voltage parameters are different for different window groups, yet the corresponding current and counter parameters are the same. To illustrate, the voltage parameter for the minimum window in window group 300 is 305V, while the same voltage parameter is 300V in window group 302 and is 295V in window group 304; thus, the corresponding voltage parameter may decrease as the temperature of the window group increases. The current and counter parameters for the same windows, however, do not change. The current and counter parameters for the $1^{st}$ window in window group 300 are 10 A and 200 counts, respectively, which are the same values for the $1^{st}$ windows in window groups 302 and 304. One reason for the difference in parameter values from one window group to the next is that a vehicle battery pack at 20° C. will be able to safely maintain a little bit different voltage than the same vehicle battery pack at 25° C. and so on. It should be appreciated that the above-noted patterns are only exemplary, as it is not necessary for all window groups, windows and/or parameters to follow the patterns described above. Returning to FIG. 2, step 206 determines or selects an entire window group based on a temperature reading.

Once a window group is determined, step 208 compares the previously measured voltage reading to the voltage parameter of the minimum window of the determined or selected window group. For the 25° C. example, the voltage parameter of the minimum window is 300V. If the measured voltage from step 204 is 293V, which is lower than the voltage parameter of 300V, then the battery pack 14 is generally in a safe mode (i.e., it is not overcharged) where its voltage is lower than the most restrictive or most onerous voltage parameter of that window group. The method proceeds to step 210 which resets all counters, and then to step 212 which sets the overall voltage threshold equal to the voltage parameter for the maximum window in the selected window group. Continuing with the example above where the measured temperature is 25° C. and the measured voltage is 293V, step 212 sets the voltage threshold to 340V because that is the voltage parameter from maximum window 318, which is the least restrictive window within selected window group 302. After which, the method loops back to step 204 so that new battery readings can be obtained and the process can begin again. Method 200 stays in this loop (i.e., steps 204-212) until the measured voltage is above the voltage parameter for the minimum window of the selected window group. During this loop or sequence of steps, the overall voltage threshold is the least restrictive for the selected or determined window group so that improved battery performance may be enjoyed. Once step 208 determines that the measured voltage exceeds the voltage parameter for the minimum window, the method proceeds to step 214. Step 208 may utilize an offset calibration value (e.g., 2V) in its comparison.

It is worth noting that if, at any time during method 200, the voltage reading that is measured or otherwise acquired in step 204 falls below the voltage parameter in the minimum window for the selected window group (300V in the example above), then step 210 resets all of the counters in the windows of the selected window group. An exemplary description of the counters is provided below.

Step 214 evaluates voltage and/or current parameters for each window in the selected window group and, if the voltage and/or current parameters for a particular window are satisfied, then the counter in that window is incremented. According to this particular embodiment, a window is evaluated by determining if the measured voltage is greater than the voltage parameter of that window and if the measured current is less than the current parameter of the window above it. A few examples are provided here to further illustrate this step. Consider the example above where the temperature is 25° C., only the measured voltage has increased from 293V to 307V and the measured current is 8 A. In window 310, the measured voltage of 307V is greater than the voltage parameter of 300V and window 310 has no current parameter to compare against; thus, both conditions are satisfied so that the counter in window 310 is incremented. In window 312, the measured voltage of 307V is greater than the voltage parameter of 305V and the measured current of 8 A is less than the current parameter of 20 A, which is the current parameter for the window above it (i.e., window 312). Because both of these conditions are satisfied, the counter in window 312 is incremented. In windows 314, 316 and 318, however, the voltage and current parameters are not both satisfied (i.e., the measured voltage of 307V is less than all of their voltage parameters), thus, the counters in those windows are maintained at their current count instead of being incremented. Although the following hypothetical examples further illustrate an exemplary embodiment for step 214, it is not necessary for every embodiment of step 214 to perform in this exact manner. For instance, the current parameter being evaluated could come from the actual window being evaluated or elsewhere, instead of coming from the next window above.

Consider the example where the temperature is still 25° C. and the measured voltage is still 307V, but the measured current is 22 A instead of 8 A. In this example, the voltage and current parameters of window 310 are satisfied, but the current condition of window 312 is not because the measured current exceeds the current parameter of the window above it (20 A from window 314). Therefore, the counter in window 310 is incremented and the counters in windows 312-318 are maintained at the current values. In another example where the temperature is still 25° C., the measured voltage is 314V, and the measured current is 19 A, the counters in windows 310-314 are all incremented. The conditions of the minimum window are easily satisfied because the measured voltage of 314V exceeds the voltage parameter of 300V (there is no separate current parameter for window 310); the conditions of windows 312 and 314 are met because the measured voltage of 314V is higher than their voltage parameters of 305V and 310V, respectively, and the measured current of 19 A is less than their current parameters of 10 A and 20 A, respectively. In yet another example where the temperature is still 25° C., the measured voltage is 320V, and the measured current is 9 A, the conditions for all of the windows in window group 302 would be satisfied and their corresponding counters would be incremented. It should be appreciated that when window 316 is evaluated, so long as the measured voltage exceeds 315V, the counter is incremented. This is because there is no current parameter for window 318, which is the window above it. As illustrated in the preceding examples, it is possible for one or more counters to be incremented within a selected window group during a single pass or loop of the method; this includes different counters that are not in adjacent windows.

Step 218 checks to see if any counter within the selected window group is equal to or greater than its counter parameter. If no counter value is equal to or greater than its counter parameter, then method 200 simply loops back to step 204 so that new voltage, current and/or temperature measurements can be taken and the process can be repeated. If one or more of the counter values are equal to or greater than their counter parameters, then the method proceeds to step 220 so that a new voltage parameter can be established. With reference again to FIG. 3, some exemplary counter parameters are provided that may be used with step 218. For instance, the minimum window in each of the window groups (e.g., window 310) includes a counter parameter of 500. This counter parameter is higher than that of the other windows in the window groups because it is assumed that the battery pack 14 can be safely maintained at a voltage around 300V for a longer amount of time than it can at the other voltage parameters in the window group, which are higher. At each successively higher window, the counter parameter is lower because the voltage parameter is higher—that is, the battery pack can generally withstand lower voltages for longer periods of time than it can higher voltages without being overcharged. To illustrate, the lowest window 310 has a voltage parameter of 300V and a counter parameter of 500 counts, while window 316 has a voltage parameter of 315V and a counter parameter of only 50 counts. The counter parameter of the maximum window 318 preferably has no value, as the voltage parameter in that window is supposed to be a hard threshold that is not to be exceeded. This is only one embodiment for performing step 218, as others are certainly possible. For example, timers and other software and/or hardware components may be used in place of the exemplary counters mentioned herein. Depending on the battery characteristics, battery chemistry, vehicle characteristics, etc., the counter parameters may have different values and follow different or no patterns than the exemplary ones described here.

As soon as one or more of the counters exceeds its corresponding counter parameter, step 220 sets the overall voltage threshold to the voltage parameter of the window where the counter parameter was exceeded. Generally, this process of adjusting or altering the voltage threshold results in a lower voltage threshold so that the threshold becomes more restrictive. In the event that two or more counters exceed their corresponding counter parameters at the same time (e.g., during the same pass or loop of method 200), then the method may use the more restrictive voltage parameter as the voltage threshold. In order to effectuate a smooth transition between voltage thresholds, step 220 may employ some type of linear or non-linear ramp for transitioning from one voltage threshold to another (e.g., the voltage threshold may be linearly ramped over a two second period). As explained in the preceding description, method 200 may use the exemplary techniques to adjust or manipulate a dynamic voltage threshold so that the battery pack 14 can be charged to a level that both avoids overcharging and undercharging. The applicants have found that such a method may strike a good balance between maintaining the battery pack 14 at a level that is not overcharged where gassing or venting can occur, while improving the performance of the battery pack by allowing it to temporary go beyond some of the more restrictive voltage parameters of the lower windows. This method takes into account the fact that during some charging events, such as regenerative braking, there may be a short sudden increase in current that could otherwise cause the battery pack to exceed a more restrictive voltage threshold, even though the battery is not in danger of being overcharged. This may be particularly true with certain battery chemistries, like nickel metal hydride (NiMH) batteries, that have a voltage lid that is far above the voltage that corresponds to 100% of the state-of-charge (SOC).

An interesting feature of exemplary method 200 is that the various counter values in the different windows may be carried over from one window group to another. To illustrate, during a first set of passes or loops through the method the battery pack temperature may be 25° C. such that one or more counters in window group 302 have a running count or tally. If the battery pack temperature increases from 25° C. to 30° C., the various counter values (i.e., the numerical counts for each of the counters) may simply be carried over to window group 304 so that evaluations involving the voltage, current and counter parameters in that window group can continue uninterrupted. This feature may avoid a situation where data—in the form of various counter values—is lost simply because the temperature of the battery pack changes slightly. Of course, this feature of carrying counter values over to a new window group is not necessary and could be altered or omitted altogether.

Step 222 checks to see if the measured voltage is higher than the voltage threshold. If this condition is false or if the answer is 'no', then method 200 loops back to step 204 where new voltage, current and/or temperature readings may be taken and the process can be repeated. If this condition is true or the answer is 'yes', then one of a number of remedial actions can be taken to reduce the voltage of the battery pack 14, step 224. There are a number of potential remedial steps that may be employed by step 224, and this method is not limited to any particular action or combination of actions. According to one exemplary technique, step 224 can cause the system 10 to discharge battery pack 14 and/or to prevent the battery pack from accepting further charge. Skilled artisans should appreciate that the present method may use any number of suitable remedial actions, as other options are certainly possible.

The different comparisons, evaluations, calculations, counts, steps, techniques, processes, methods, etc. that are described above may be carried out in any number of suitable pieces of hardware located throughout the vehicle. This includes, but is certainly not limited to, a vehicle integrated control module (VICM), a vehicle power integrated module (VPIM), or some other vehicle electronic module that is in communication with battery pack 14 or the like.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method for use with a vehicle battery pack, comprising the steps of:
   (a) receiving one or more battery reading(s) for the vehicle battery pack, wherein the battery reading(s) are received from battery sensors and include a temperature reading and a voltage reading;
   (b) using the temperature reading to determine a voltage threshold for the vehicle battery pack, wherein the voltage threshold is a dynamic threshold that is altered over time in order to accommodate high-current, short-duration charging events; and
   (c) comparing the voltage reading to the voltage threshold so that the vehicle battery pack is not overcharged.

2. The method of claim 1, wherein step (b) further comprises using the temperature reading to select a window group, and using the selected window group to determine the voltage threshold.

3. The method of claim 2, wherein if the temperature reading is in between two successive window groups, then step (b) further comprises interpolating values for a new window group that are in between those of the two successive window groups.

4. The method of claim 2, wherein step (b) further comprises:
   i) using the temperature reading to select a window group from a plurality of potential window groups, wherein each of the potential window groups includes a plurality of potential windows;
   ii) using the voltage reading to select a window from the plurality of potential windows in the selected window group, wherein each window includes a voltage parameter, a counter parameter, and a counter;
   iii) incrementing the counter in the selected window; and
   iv) comparing the incremented counter to the counter parameter in the selected window, and if the counter is equal to or greater than the counter parameter, then setting the voltage threshold equal to the voltage parameter in the selected window.

5. The method of claim 4, wherein step ii) further comprises comparing the voltage reading to a voltage parameter in a first window and comparing a current reading to a current parameter in a second window and, if both of these comparisons are satisfied, then selecting the first window from the plurality of potential windows in the selected window group.

6. The method of claim 4, wherein the voltage parameters in the windows of the selected window group increase from a minimum window to a maximum window, wherein the minimum window has a more restrictive voltage parameter than the maximum window.

7. The method of claim 4, wherein the counter parameters in the windows of the selected window group decrease from a minimum window to a maximum window, wherein the minimum window has a more restrictive voltage parameter than the maximum window.

8. The method of claim 4, wherein step iii) further comprises incrementing counters in two or more selected windows during a single pass of the method.

9. The method of claim 4, wherein if a new temperature reading for the vehicle battery pack is received and a new window group is selected, then the counters in the windows of the newly selected window group maintain the same counts as the counters in the windows of the previously selected window group.

10. The method of claim 1, further comprising the step of:
    initializing the voltage threshold by setting the voltage threshold equal to a voltage parameter in a selected window group, wherein the voltage parameter is the least restrictive voltage parameter in the selected window group.

11. The method of claim 1, wherein step (c) further comprises comparing the voltage reading to the voltage threshold and, if the voltage reading is equal to or greater than the voltage threshold, then taking a remedial action to prevent the vehicle battery pack from overcharging.

12. A method for use with a vehicle battery pack, comprising the steps of:
    (a) receiving one or more battery reading(s) for the vehicle battery pack, wherein the battery reading(s) are received from battery sensors and include a temperature reading and a current reading;
    (b) using the temperature reading and the current reading to select a voltage threshold, wherein the voltage threshold is a dynamic threshold that is altered over time in order to accommodate high-current, short-duration charging events; and
    (c) altering the voltage threshold over time so that the vehicle battery pack is not overcharged.

13. The method of claim 12, wherein step (b) further comprises:
    i) using the temperature reading to select a window group from a plurality of potential window groups, wherein each of the potential window groups includes a plurality of potential windows;
    ii) using a voltage reading and the current reading to select a window from the plurality of potential windows in the selected window group, wherein each window includes a voltage parameter, a counter parameter, and a counter;
    iii) incrementing the counter in the selected window; and
    iv) comparing the incremented counter to the counter parameter in the selected window, and if the counter is equal to or greater than the counter parameter, then setting the voltage threshold equal to the voltage parameter in the selected window.

14. The method of claim 12 wherein if a new temperature reading for the vehicle battery pack is received and a new window group is selected, then the counters in the windows of the newly selected window group maintain the same counts as the counters in the windows of the previously selected window group.

15. The method of claim 12, further comprising the step of:
    initializing the voltage threshold by setting the voltage threshold equal to a voltage parameter in a selected window group, wherein the voltage parameter is the least restrictive voltage parameter in the selected window group.

16. The method of claim 12, further comprising the step of:
    comparing a voltage reading to the voltage threshold and, if the voltage reading is equal to or greater than the voltage threshold, then taking a remedial action to prevent the vehicle battery pack from overcharging.

17. A method for use with a vehicle battery pack, comprising the steps of:
(a) receiving a voltage reading and a current reading for the vehicle battery pack, wherein the voltage reading and the current reading are received from battery sensors;
(b) evaluating the voltage reading and the current reading against a voltage parameter and a current parameter, respectively, and if the voltage reading and the current reading satisfy the voltage parameter and the current parameter then incrementing a counter; and
(c) establishing a new voltage threshold when the counter exceeds a counter parameter, wherein the voltage threshold is used when charging the vehicle battery pack so that it is not overcharged.

* * * * *